(12) United States Patent
Cao

(10) Patent No.: US 12,074,997 B2
(45) Date of Patent: Aug. 27, 2024

(54) FOLDABLE DISPLAY PANEL

(71) Applicants: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

(72) Inventor: Huan Cao, Wuhan (CN)

( * ) Notice: Subject to any disclaimer, the term of this patent is extended or adjusted under 35 U.S.C. 154(b) by 0 days.

(21) Appl. No.: 17/604,782

(22) PCT Filed: Aug. 3, 2021

(86) PCT No.: PCT/CN2021/110267
§ 371 (c)(1),
(2) Date: Oct. 19, 2021

(87) PCT Pub. No.: WO2023/000380
PCT Pub. Date: Jan. 26, 2023

(65) Prior Publication Data
US 2024/0022656 A1 Jan. 18, 2024

(30) Foreign Application Priority Data
Jul. 20, 2021 (CN) .......................... 202110816863.3

(51) Int. Cl.
*H04M 1/02* (2006.01)
*F16C 11/04* (2006.01)
*H05K 7/20* (2006.01)

(52) U.S. Cl.
CPC ........... *H04M 1/0268* (2013.01); *F16C 11/04* (2013.01); *H04M 1/0214* (2013.01); *H05K 7/20963* (2013.01)

(58) Field of Classification Search
CPC ............. H04M 1/0268; H04M 1/0214; H04M 2201/38; H04M 1/022; H04M 1/021;
(Continued)

(56) References Cited

U.S. PATENT DOCUMENTS

2016/0212890 A1    7/2016  Jeong et al.

FOREIGN PATENT DOCUMENTS

| CN | 108419425 A | 8/2018 |
|---|---|---|
| CN | 109285820 A | 1/2019 |

(Continued)

OTHER PUBLICATIONS

He, (CN 109348008A), Display device, Feb. 2019,pp. 1-4 (Year: 2019).*

(Continued)

*Primary Examiner* — Keith Ferguson

(57) ABSTRACT

This application provides a foldable display panel. A foldable portion in the foldable display panel includes a fixed mechanism and a rotary mechanism rotatably connected to the fixed mechanism. The rotary mechanism includes a first rotary mechanism and a second rotary mechanism. The first rotary mechanism is connected to a first flat portion. The second rotary mechanism is connected to a second flat portion. A heat dissipation member is connected to at least one of the first rotary mechanism and the second rotary mechanism. By means of this application, a risk of wear is reduced for the rotary mechanism.

17 Claims, 9 Drawing Sheets

(58) Field of Classification Search
CPC .............. H04M 1/0233; H04M 1/0225; H05K 7/20963; H05K 7/20954; H05K 7/20981; F16C 11/04
See application file for complete search history.

(56) References Cited

FOREIGN PATENT DOCUMENTS

| | | | | |
|---|---|---|---|---|
| CN | 109348008 | A | 2/2019 | |
| CN | 109817106 | A | 5/2019 | |
| CN | 110850924 | A | 2/2020 | |
| CN | 111105713 | A | 5/2020 | |
| CN | 111402728 | A | 7/2020 | |
| CN | 112349206 | A | 2/2021 | |
| CN | 112954985 | A | 6/2021 | |
| CN | 112349206 | B * | 7/2022 | ............. G09F 9/301 |
| EP | 2090957 | A2 | 8/2009 | |
| KR | 100968587 | B1 | 7/2010 | |

OTHER PUBLICATIONS

Tsunoda et al. (CN 101511160B), Portable electronic device, Apr. 2012, pp. 1-8 (Year: 2012).*
Song et al. (KR 20200129880 A), Electroni device including heating transfer (Year: 2020).*

* cited by examiner

FOLDABLE DISPLAY PANEL

BACKGROUND

Technical Field

This application relates to the field of display technologies, and in particular, to a foldable display panel.

Related Art

With continuous update of mobile phone technologies and pursuit of large-screen mobile phones, a foldable mobile phone comes into being. The foldable mobile phone has a size approximate to a size of an ordinary mobile phone when folded, facilitating carrying around, and may be used as a small-sized tablet computer when unfolded, providing both entertainment and office functions. Therefore, the foldable mobile phone satisfies requirements of consumers for portability and diversified functions. Folding between a left part and a right part of a conventional foldable mobile phone is mainly realized by using a rotary hinge mechanism. During torsion realization of the rotary hinge mechanism, a lot of heat is generated as a result of friction between rotary components, resulting in a relatively large temperature at a position of rotation. Therefore, grease oxidizes, causing relatively severe wear to the parts and affecting a service life.

Therefore, the conventional foldable mobile phone whose rotary mechanism is prone to wear requires improvement.

SUMMARY

Embodiments of this application provide a foldable display panel, to alleviate a technical problem that a rotary mechanism of a conventional foldable mobile phone is prone to wear.

To resolve the foregoing technical problem, this application provides the following technical solutions:

An embodiment of this application provides a foldable display panel. The foldable display panel includes:
- a flat portion, comprising a first flat portion and a second flat portion;
- a foldable portion, comprising a fixed mechanism and a rotary mechanism rotatably connected to the fixed mechanism, where the rotary mechanism comprises a first rotary mechanism and a second rotary mechanism, the first rotary mechanism is connected to the first flat portion, and the second rotary mechanism is connected to the second flat portion; and
- a heat dissipation member, connected to at least one of the first rotary mechanism and the second rotary mechanism.

In an embodiment, a first accommodation cavity is formed in the heat dissipation member, and the first accommodation cavity is filled with a cooling medium.

In an embodiment, the cooling medium is a liquid.

In an embodiment, the rotary mechanism comprises a rotary shaft and a rotary wheel disposed about the rotary shaft. The rotary shaft is connected to the fixed mechanism. The rotary wheel is connected to the flat portion. The heat dissipation member is fixedly connected to and coaxial with the rotary shaft.

In an embodiment, two ends of the heat dissipation member are fixedly connected to and coaxial with two ends of the rotary shaft respectively.

In an embodiment, the fixed mechanism comprises a first fixed sub-mechanism and a second fixed sub-mechanism independent of each other. The rotary mechanism comprises a first rotary sub-mechanism and a second rotary sub-mechanism. The first rotary sub-mechanism is connected to the first fixed sub-mechanism. The second rotary sub-mechanism is connected to the second fixed sub-mechanism. A first end of the rotary shaft of the first rotary sub-mechanism is connected to and coaxial with the heat dissipation member. A second end of the rotary shaft of the first rotary sub-mechanism is rotatably connected to the first fixed sub-mechanism. A first end of the rotary shaft of the second rotary sub-mechanism is rotatably connected to the second fixed sub-mechanism. A second end of the rotary shaft of the second rotary sub-mechanism is fixedly connected to and coaxial with the heat dissipation member.

In an embodiment, the fixed mechanism comprises a first fixed sub-mechanism and a second fixed sub-mechanism independent of each other. The rotary mechanism comprises a first rotary sub-mechanism and a second rotary sub-mechanism. The rotary shaft of the first rotary sub-mechanism is rotatably connected to the first fixed sub-mechanism. The rotary shaft of the second rotary sub-mechanism is rotatably connected to the second fixed sub-mechanism. The heat dissipation member comprises a first heat dissipation sub-member and a second heat dissipation sub-member. Two ends of the first heat dissipation sub-member are fixedly connected to and coaxial with two ends of the rotary shaft of the first rotary sub-mechanism respectively. Two ends of the second heat dissipation sub-member are fixedly connected to and coaxial with two ends of the rotary shaft of the second rotary sub-mechanism respectively.

In an embodiment, at least one first connection point exists between the first heat dissipation sub-member and the second heat dissipation sub-member.

In an embodiment, the fixed mechanism comprises a first fixed sub-mechanism and a second fixed sub-mechanism independent of each other. The rotary mechanism comprises a first rotary sub-mechanism and a second rotary sub-mechanism. The first rotary sub-mechanism is connected to the first fixed sub-mechanism, the second rotary sub-mechanism is connected to the second fixed sub-mechanism. The first rotary sub-mechanism and the second rotary sub-mechanism share one rotary shaft. A first end of the rotary shaft is fixedly connected to and coaxial with a first end of the heat dissipation member. A second end of the rotary shaft is fixedly connected to and coaxial with a second end of the heat dissipation member.

In an embodiment, at least one second connection point exists between a middle of the rotary shaft and a middle of the heat dissipation member.

In an embodiment, the heat dissipation member and the connecting shaft are integrally formed.

In an embodiment, the heat dissipation member and the connecting shaft are separately formed.

In an embodiment, a second accommodation cavity is formed in the rotary shaft. The first accommodation cavity of the heat dissipation member communicates with the second accommodation cavity. The cooling medium is filled in the first accommodation cavity and the second accommodation cavity.

In an embodiment, the first rotary mechanism is connected to a first heat dissipation member. The second rotary mechanism is connected to a second heat dissipation member. At least one connection point exists between the first heat dissipation member and the second heat dissipation member.

In an embodiment, a second accommodation cavity is formed in the rotary shaft. A third accommodation cavity is formed in the fixed mechanism. The first accommodation cavity, the second accommodation cavity, and the third accommodation cavity communicate with each other. The cooling medium is filled in the first accommodation cavity, the second accommodation cavity, and the third accommodation cavity.

In an embodiment, the heat dissipation member is connected to at least one of the first flat portion and the second flat portion.

In an embodiment, a sliding groove is provided on at least one of the first flat portion and the second flat portion. The heat dissipation member is embedded in the sliding groove. The heat dissipation member is slid along the sliding groove during folding of the foldable display panel.

In an embodiment, at least part of the heat dissipation member is in a shape of a broken line or a curved line.

In an embodiment, heat dissipation fins are disposed on an outer wall of the heat dissipation member.

In an embodiment, a material of the heat dissipation fins is graphite or graphene.

This application provides a foldable display panel. The foldable display panel includes a flat portion, a foldable portion, and a heat dissipation member. The flat portion includes a first flat portion and a second flat portion. The foldable portion includes a fixed mechanism and a rotary mechanism rotatably connected to the fixed mechanism. The rotary mechanism includes a first rotary mechanism and a second rotary mechanism. The first rotary mechanism is connected to the first flat portion. The second rotary mechanism is connected to the second flat portion. The heat dissipation member is connected to at least one of the first rotary mechanism and the second rotary mechanism. According to this application, a heat dissipation member connected to the rotary mechanism is disposed. During the folding of the display panel, heat generated by the rotary mechanism is taken away by the heat dissipation member. In this way, abrasive dust on a contact surface caused by oxidation of lubricating grease at the rotary mechanism at a relatively high temperature is alleviated, reducing a risk of wear for the rotary mechanism.

BRIEF DESCRIPTION OF THE DRAWINGS

The following describes specific implementations of this application in detail with reference to the accompanying drawings, to make the technical solutions and other beneficial effects of this application obvious.

DETAILED DESCRIPTION

The technical solutions of the embodiments of the present disclosure are clearly and completely described in the following with reference to the accompanying drawings of the embodiments of the present disclosure. Apparently, the described embodiments are merely some but not all of the embodiments of the present disclosure. All other embodiments obtained by a person skilled in the art based on the embodiments of the present disclosure without creative efforts shall fall within the protection scope of the present disclosure.

The embodiments of this application provide a foldable display panel, to alleviate a technical problem that a rotary mechanism of a conventional foldable mobile phone is prone to wear. The foldable display panel includes a flat portion, a foldable portion, and a heat dissipation member. The flat portion includes a first flat portion and a second flat portion. The foldable portion includes a fixed mechanism and a rotary mechanism rotatably connected to the fixed mechanism. The rotary mechanism includes a first rotary mechanism and a second rotary mechanism. The first rotary mechanism is connected to the first flat portion. The second rotary mechanism is connected to the second flat portion. The heat dissipation member is connected to at least one of the first rotary mechanism and the second rotary mechanism.

Figure 1:
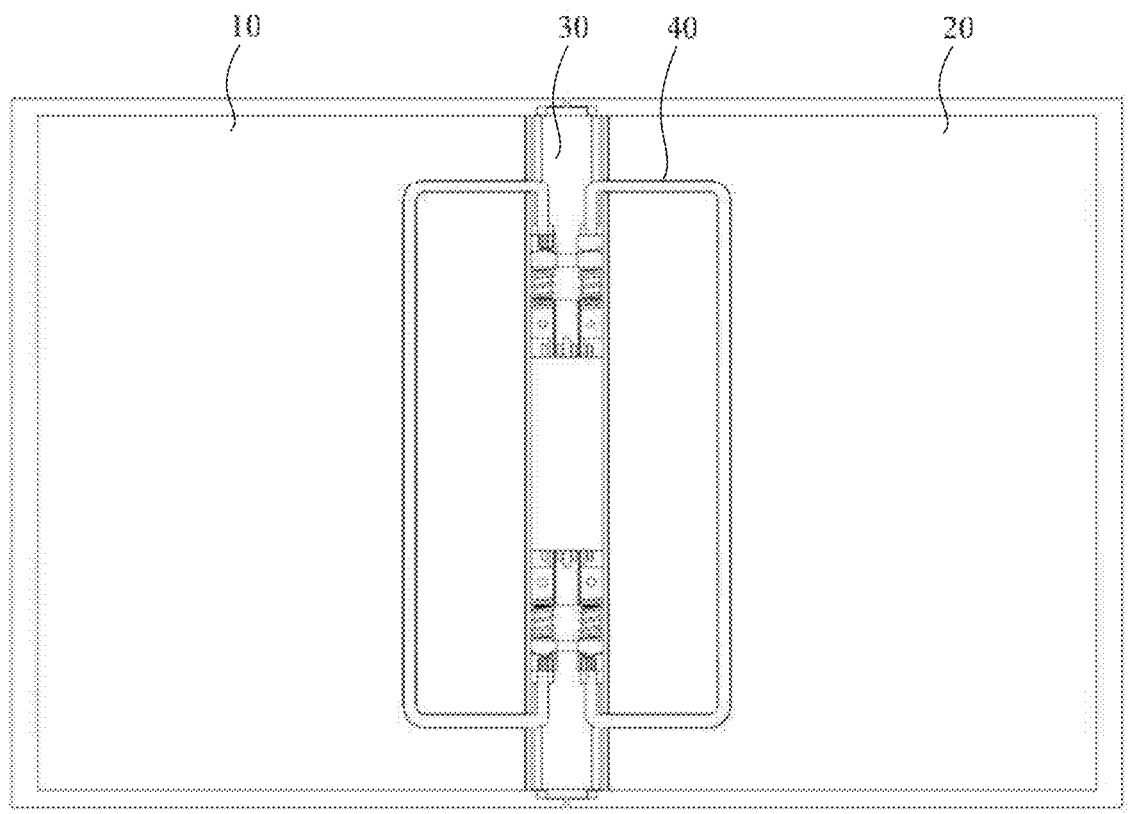
FIG. 1 is a schematic diagram of a planar structure of a foldable display panel according to an embodiment of this application.

As shown in FIG. 1, the foldable display panel includes a flat portion, a foldable portion 30, and a heat dissipation member 40. The flat portion includes a first flat portion 10 and a second flat portion 20. The first flat portion 10 and the second flat portion 20 each include a housing and a display screen. The first flat portion 10 is connected to the second flat portion 20 by using the foldable portion 30. The first flat portion and the second flat portion are fully unfolded, fully folded, or partially folded by using the foldable portion 30. When the first flat portion and the second flat portion are fully unfolded, the display screens of the first flat portion 10 and the second flat portion 20 are on a same plane. When the first flat portion and the second flat portion are fully folded, the display screens of the first flat portion 10 and the second flat portion 20 are attached to each other. When the first flat portion and the second flat portion are partially folded, the first flat portion 10 and the second flat portion 20 are at an included angle with the foldable portion 30 as a center. The included angle is in a range of 0 degrees to 180 degrees.

Figure 2:
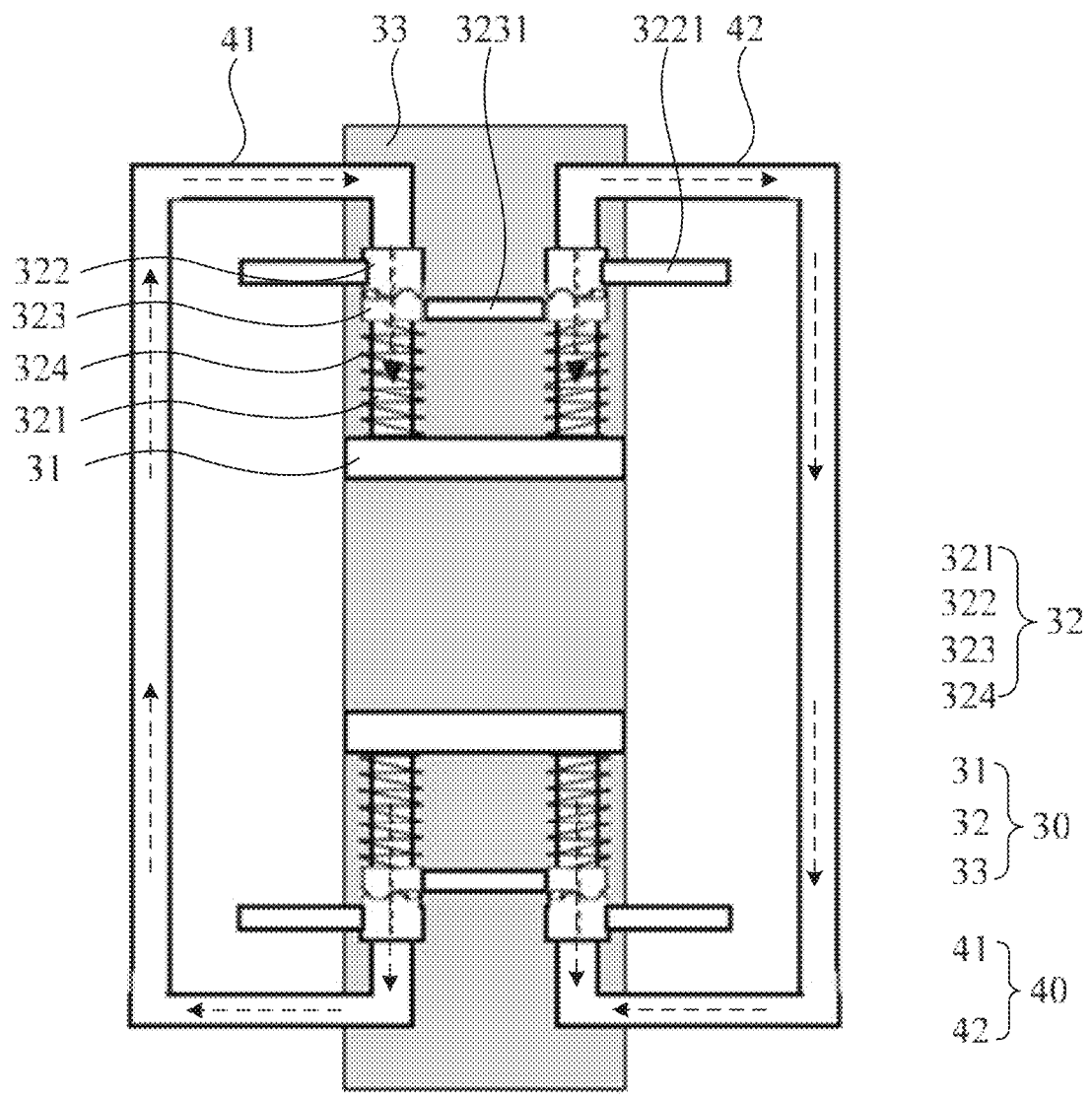
FIG. 2 is a schematic diagram of a first structure of a foldable portion and a heat dissipation member in the foldable display panel according to an embodiment of this application.

With reference to FIG. 1 and FIG. 2, the foldable portion 30 includes a fixed mechanism 31, a rotary mechanism 32, and a rotary shaft cover 33. The fixed mechanism 31 is fixed to the rotary shaft cover 33. The rotary mechanism 32 is rotatably connected to the fixed mechanism 31. The rotary mechanism 32 includes a first rotary mechanism and a second rotary mechanism. The first rotary mechanism is connected to the first flat portion 10. The second rotary mechanism is connected to the second flat portion 20. When the first rotary mechanism and the second rotary mechanism are rotated relative to the fixed mechanism 31, the first flat portion 10 and the second flat portion 20 are driven to switch between the three states of fully unfolded, fully folded, and partially folded.

The heat dissipation member 40 is connected to at least one of the first rotary mechanism and the second rotary mechanism. That is to say, the heat dissipation member may be connected to only the first rotary mechanism, or may be connected to only the second rotary mechanism, or may be connected to both the first rotary mechanism and the second rotary mechanism. In FIG. 2, the heat dissipation member 40 is connected to both the first rotary mechanism and the second rotary mechanism, for example. In this case, the heat dissipation member 40 includes a first heat dissipation member 41 connected to the first rotary mechanism and a second heat dissipation member 42 connected to the second rotary mechanism.

During rotation of the rotary mechanism 32, a lot of heat is generated as a result of friction between rotary components, resulting in a relatively large temperature at a position of rotation. Therefore, grease oxidizes, causing relatively severe wear to the parts and affecting a service life. According to this application, a heat dissipation member 40 connected to the rotary mechanism 32 is disposed. During the folding of the display panel, heat generated by the rotary mechanism is taken away by the heat dissipation member. In this way, abrasive dust on a contact surface caused by oxidation of lubricating grease at the rotary mechanism at a relatively high temperature is alleviated, reducing a risk of wear for the rotary mechanism.

Figure 3:
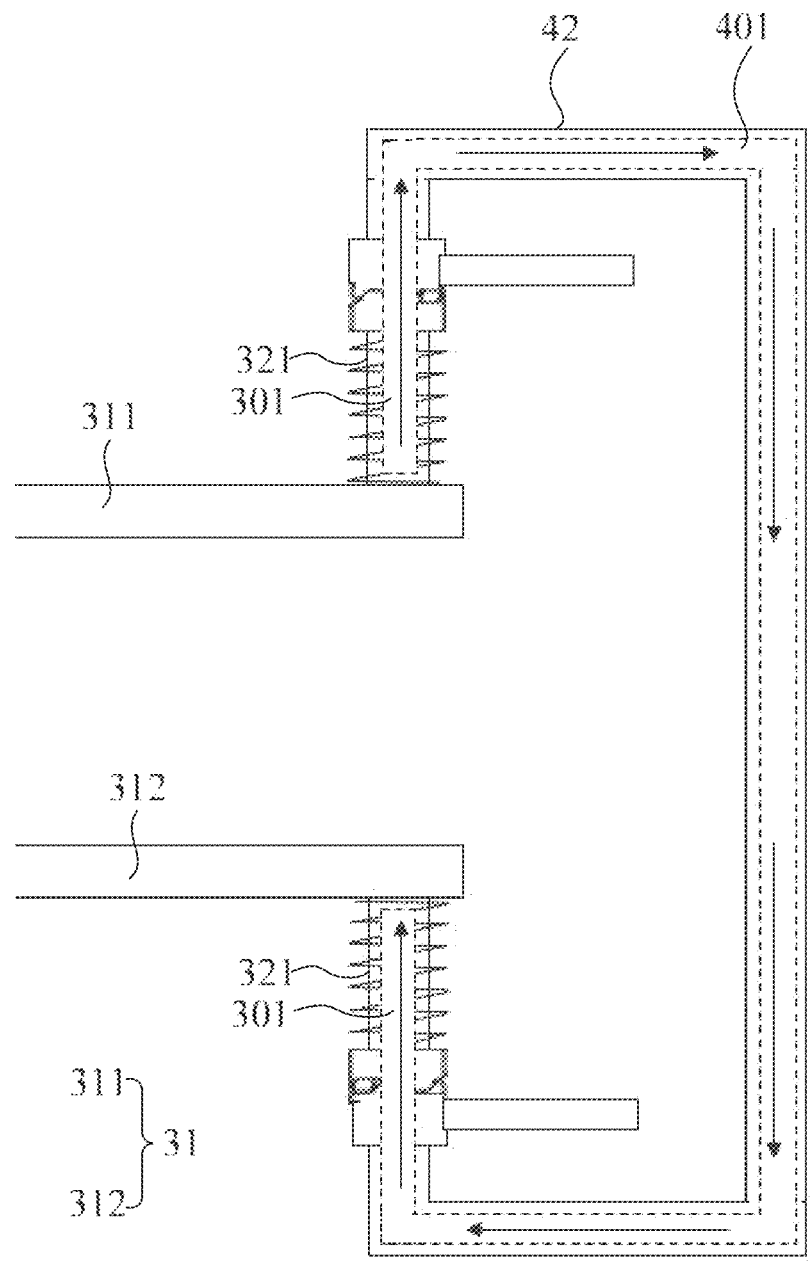
FIG. 3 is a schematic diagram of a second structure of the foldable portion and the heat dissipation member in the foldable display panel according to an embodiment of this application.

In an embodiment, a first accommodation cavity is formed in the heat dissipation member, and the first accommodation cavity is filled with a cooling medium. With reference to FIG. 2 and FIG. 3, the heat dissipation member 40 may be a hollow heat dissipation pipe having a first accommodation cavity 401 inside. The first accommodation cavity 401 is filled with the cooling medium. The cooling medium may be water or a liquid having relatively desirable fluidity added with electrolytes. When the rotary mechanism 32 generates heat as a result of rotation, the cooling medium therein undergoes self-circulation by virtue of the principle of thermal expansion and contraction of liquids. In FIG. 3, dashed lines inside the second heat dissipation member 42 represent an inner wall of the heat dissipation pipe, and arrows represent a manner in which the cooling medium flows. By means of the cooling medium, the heat can be transferred to other places, thereby reducing the risk of wear for the rotary mechanism.

In an embodiment, as shown in FIG. 2, the rotary mechanism 32 includes a rotary shaft 321, a rotary wheel disposed about the rotary shaft 321, and a spring 324. The rotary shaft 321 is connected to the fixed mechanism 31. The rotary wheel is connected to the flat portion. The heat dissipation member 40 is fixedly connected to and coaxial with the rotary shaft 321. The rotary wheel includes a first rotary wheel 322 and a second rotary wheel 323 mated with each other. The first rotary wheel 322 and the second rotary wheel 323 are a set of concave-convex wheels. The two wheels are both matched by using concave surfaces and convex surfaces. The first rotary wheel 322 includes a connecting member 3221. The connecting member 3221 is connected to the housing of the flat portion. During folding between the first flat portion 10 and the second flat portion 20, the rotary shaft 321 drives the first rotary wheel 322 to rotate. As a depth of the engagement between the concave surfaces and the convex surfaces of the first rotary wheel 322 and the second rotary wheel 323 changes, the second rotary wheel 323 is moved in an axial direction of the rotary shaft 321, so that the spring 324 is compressed. The second rotary wheel 323 of the first rotary mechanism is connected to the second rotary wheel 323 of the second rotary mechanism by using a fixed member 3231, so that the two second rotary wheels 323 are simultaneously moved in the axial direction. Since the heat dissipation member 40 is fixedly connected to and coaxial with the rotary shaft 321, the heat dissipation member 40 is also rotated with the rotary shaft 321.

In an embodiment, two ends of the heat dissipation member are fixedly connected to and coaxial with two ends of the rotary shaft respectively. The rotary shaft 321 is rotatably connected to the fixed mechanism 31 to realize unfolding and folding between the first flat portion 10 and the second flat portion 20. As a manner of connection between the rotary shaft 321 and the fixed mechanism 31 varies, a manner of connection between the heat dissipation member 40 and the rotary shaft 321 also varies. For ease of description, the second rotary mechanism and the second heat dissipation member 42 are exemplified for description in the following embodiments. A manner of connection between the first rotary mechanism and a first heat dissipation member 41 is similar.

In an embodiment, as shown in FIG. 3, the fixed mechanism 31 includes a first fixed sub-mechanism 311 and a second fixed sub-mechanism 312 independent of each other. The second rotary mechanism includes a first rotary sub-mechanism and a second rotary sub-mechanism. The first rotary sub-mechanism and the second rotary sub-mechanism are respectively connected to the first fixed sub-mechanism 311 and the second fixed sub-mechanism 312. The first rotary sub-mechanism and the second rotary sub-mechanism each include the rotary shaft 321 and the rotary wheel disposed about the rotary shaft 321. A first end of the rotary shaft 321 of the first rotary sub-mechanism is connected to and coaxial with the second heat dissipation member 42. A second end of the rotary shaft of the first rotary sub-mechanism is rotatably connected to the first fixed sub-mechanism 311. A first end of the rotary shaft 321 of the second rotary sub-mechanism is rotatably connected to the second fixed sub-mechanism 312. A second end of the rotary shaft of the second rotary sub-mechanism is fixedly connected to and coaxial with the second heat dissipation member 42. In this case, the second heat dissipation member 42 corresponding to the second flat portion 20 forms a heat dissipation circulation loop.

Figure 4:
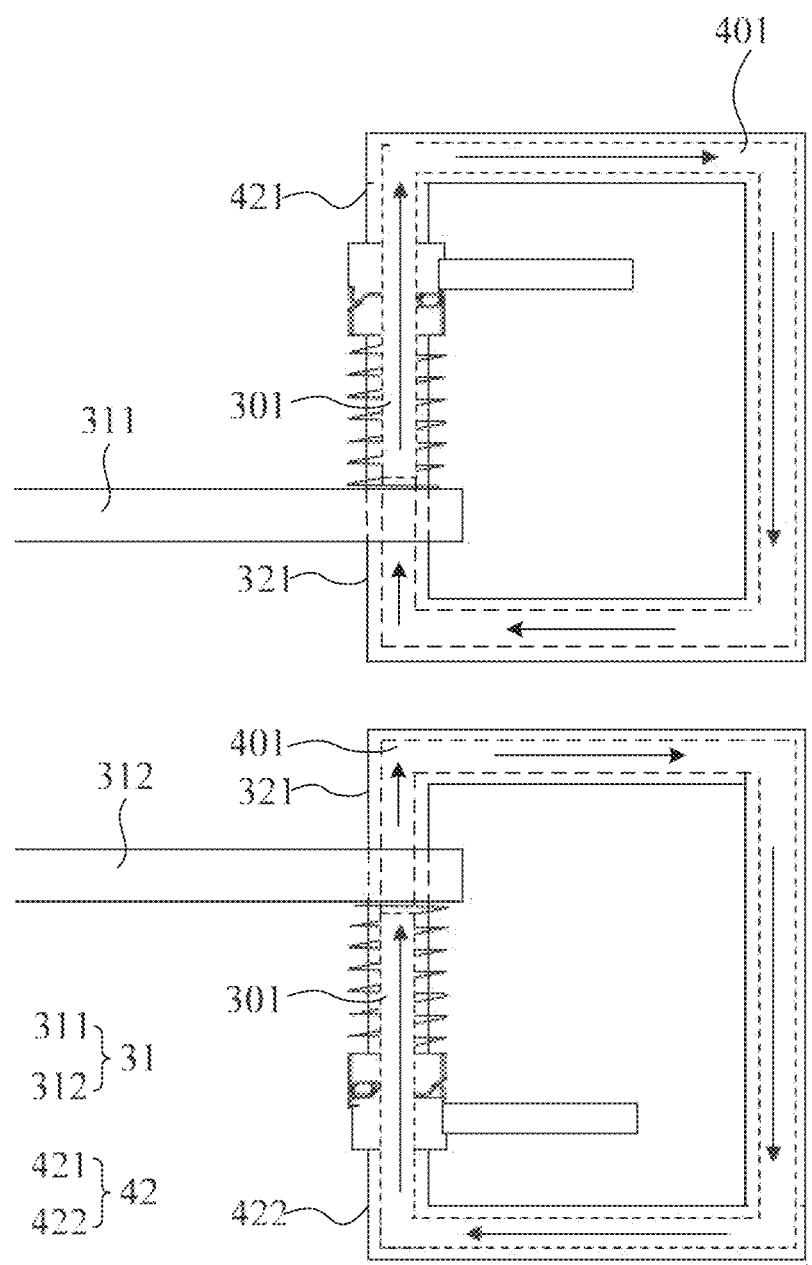
FIG. 4 is a schematic diagram of a third structure of the foldable portion and the heat dissipation member in the foldable display panel according to an embodiment of this application.

In an embodiment, differences from the embodiment of FIG. 3 are shown in FIG. 4. The rotary shaft 321 of the first rotary sub-mechanism is rotatably connected to the first fixed sub-mechanism 311. The rotary shaft 321 of the second rotary sub-mechanism is rotatably connected to the second fixed sub-mechanism 312. The second heat dissipation member 42 includes a first heat dissipation sub-member 421 and a second heat dissipation sub-member 422. Two ends of the first heat dissipation sub-member 421 are fixedly connected to and coaxial with two ends of the rotary shaft 321 of the first rotary sub-mechanism respectively. Two ends of the second heat dissipation sub-member 422 are fixedly connected to and coaxial with two ends of the rotary shaft 321 of the second rotary sub-mechanism respectively. In this case, the second heat dissipation member 42 corresponding to the second flat portion 20 forms two heat dissipation circulation loops.

Figure 5:
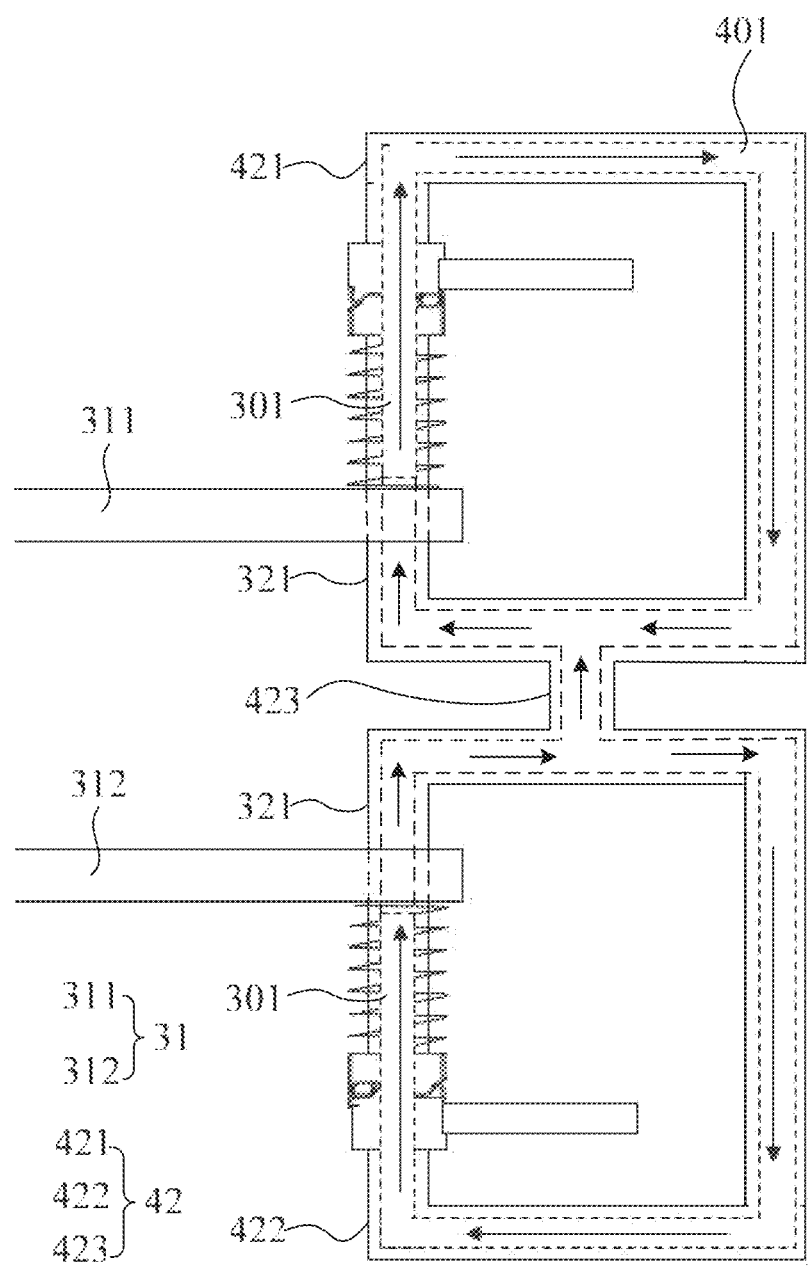
FIG. 5 is a schematic diagram of a fourth structure of the foldable portion and the heat dissipation member in the foldable display panel according to an embodiment of this application.

In an embodiment, a difference from the embodiment of FIG. 4 is shown in FIG. 5. At least one first connection point 423 exists between the first heat dissipation sub-member 421 and the second heat dissipation sub-member 422, so that the two heat dissipation circulation loops are connected to each other to form a large heat dissipation circulation loop. Since a heat dissipation path may be split into two paths at the first connection point 423, a heat dissipation effect is enhanced.

Figure 6:
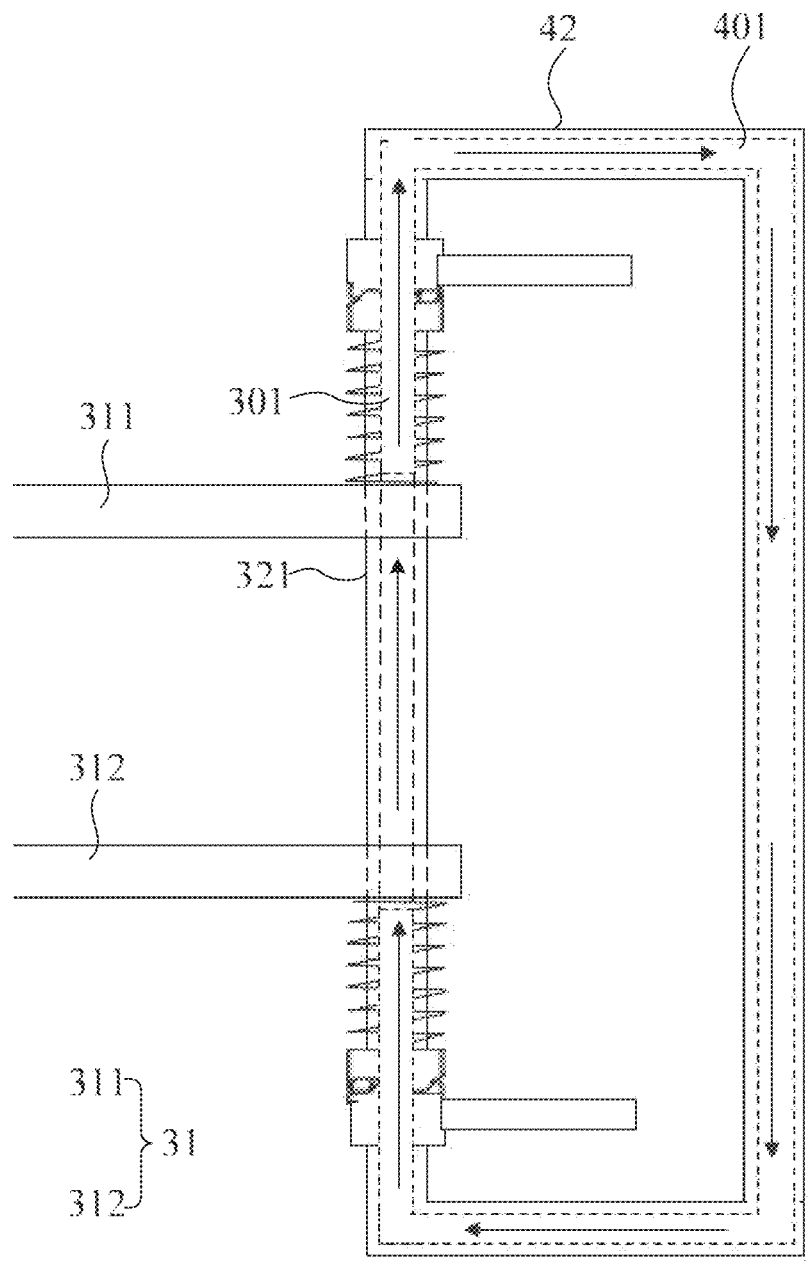
FIG. 6 is a schematic diagram of a fifth structure of the foldable portion and the heat dissipation member in the foldable display panel according to an embodiment of this application.

In an embodiment, a difference from the embodiment of FIG. 3 is shown in FIG. 6. The first rotary sub-mechanism and the second rotary sub-mechanism share one rotary shaft 321. That is to say, the rotary shaft 321 is rotatably connected to both the first fixed sub-mechanism 311 and the second fixed sub-mechanism 312. In this case, the first end of the rotary shaft 321 is fixedly connected to and coaxial with a first end of the second heat sink 42, and the second end of the rotary shaft 321 is fixedly connected to and coaxial with a second end of the second heat sink 42, so as to form a heat dissipation circulation loop.

Figure 7:
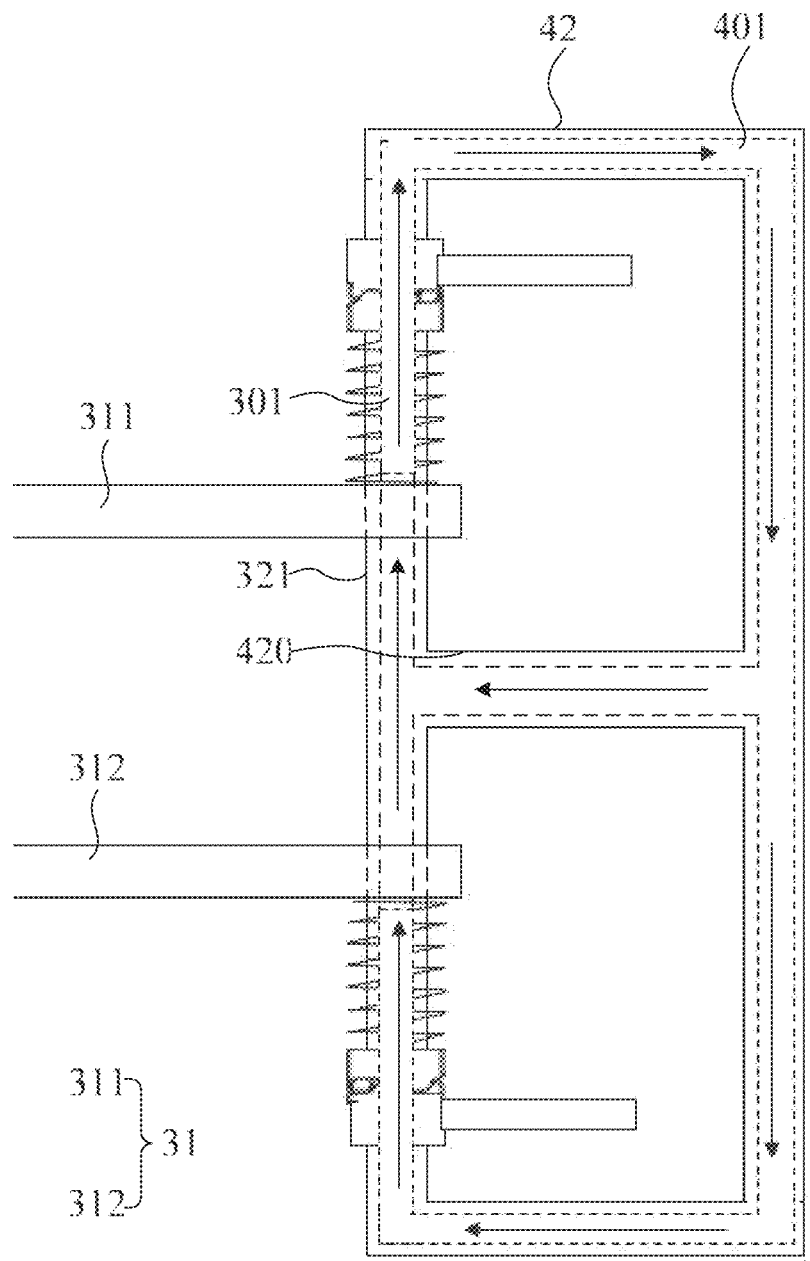
FIG. 7 is a schematic diagram of a sixth structure of the foldable portion and the heat dissipation member in the foldable display panel according to an embodiment of this application.

In an embodiment, a difference from the embodiment of FIG. 6 is shown in FIG. 7. At least one second connection point 420 exists between a middle of the rotary shaft 321 and a middle of the second heat sink 42. Since a heat dissipation path may be split into two paths at the second connection point 420, a heat dissipation effect is enhanced.

By means of the above embodiments, one or two heat dissipation circulation loops can be formed corresponding to each flat portion. Since the two ends of the heat sink 40 are fixedly connected to and are coaxial with the two ends of the rotary shaft 321, the heat sink and the rotary shaft may be integrally formed for more tight connection and prevent leakage of the cooling medium. Certainly, the heat sink and the rotary shaft may also be separately formed and then assembled. The manner of connection between the rotary shaft 321 and the heat sink 40 is not limited in this application, and may be set as required.

In an embodiment, a second accommodation cavity is formed in the rotary shaft. The first accommodation cavity of the heat dissipation member communicates with the second accommodation cavity. The cooling medium is filled in the first accommodation cavity and the second accommodation cavity. As shown in FIG. 3 to FIG. 7, a second accommodation cavity 301 is formed in the rotary shaft(s) 321 of both the first rotary sub-mechanism and the second rotary sub-mechanism. The first accommodation cavity 402 of the second heat dissipation member 42 communicates with the second accommodation cavity 301. The cooling medium is filled in the first accommodation cavity 402 and the second accommodation cavity 301 During folding between the first flat portion 10 and the second flat portion 20, a lot of heat is generated as a result of friction between the concave wheels and the convex wheels in the rotary mechanisms that are mated with each other. Since the second accommodation cavity 301 of the rotary shaft 321 communicates with the first accommodation cavity 402 of the second heat dissipation member 42, and the cooling medium is filled in both the first accommodation cavity 402 and the second accommodation cavity 301, the heat at a position of friction between the concave wheels and the convex wheels can be quickly taken away. In this way, abrasive dust on a contact surface caused by oxidation of lubricating grease at the position at a relatively high temperature is alleviated, reducing a risk of wear for the rotary mechanism, and prolonging a life service of the rotary shaft 321.

Manners of arranging the heat dissipation member 40 on a single side are described in the above embodiments. When the heat dissipation member 40 is disposed on both sides, the first heat dissipation member 41 and the second heat dissipation member 42 may be independent of each other, or may be connected to each other.

In an embodiment, the first rotary mechanism is connected to the first heat dissipation member 41, and the second rotary mechanism is connected to the second heat dissipation member 42. At least one connection point exists between the first heat dissipation member 41 and the second heat dissipation member 42. The first heat dissipation member 41 and the second heat dissipation member 42 may be arranged in any of the manners in FIG. 3 to FIG. 7. The heat dissipation circulation loop formed by the first heat dissipation member 41 and the heat dissipation circulation loop formed by the second heat dissipation member 42 are connected by using the connection points, so as to form a large heat dissipation loop. In this way, the heat dissipation effect is more desirable.

Figure 8:
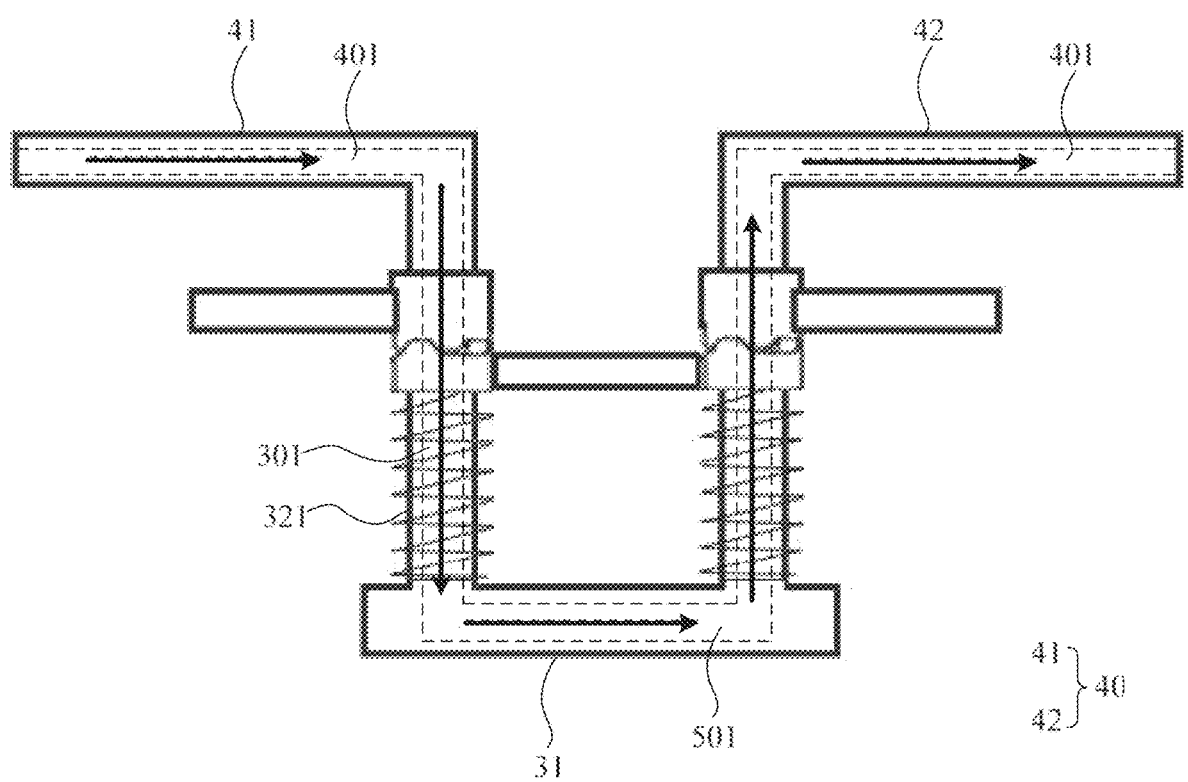
FIG. 8 is a schematic diagram of a seventh structure of the foldable portion and the heat dissipation member in the foldable display panel according to an embodiment of this application.

In an embodiment, a second accommodation cavity is formed in the rotary shaft, and a third accommodation cavity is formed in the fixed mechanism. The first accommodation cavity, the second accommodation cavity, and the third accommodation cavity communicate with each other. The cooling medium is filled in the first accommodation cavity, the second accommodation cavity, and the third accommodation cavity. As shown in FIG. 8, a first accommodation cavity 401 is formed in each of the first heat dissipation member 41 and the second heat dissipation member 42, and a second accommodation cavity 301 is formed in each of the rotary shaft 321 of the first rotary mechanism and the rotary shaft of the second rotary mechanism. The fixed mechanism 31 is used as a connection point between the first heat dissipation member 41 and the second heat dissipation member 42. The fixed mechanism 31 provides a fixing function, and has a third accommodation cavity 501 formed therein. The first accommodation cavity 401, the second accommodation cavity 301, and the third accommodation cavity 501 communicate with each other, and the cooling medium is filled in the three accommodation cavities. According to different heat dissipation paths, the cooling medium may move in the first accommodation cavity 401, the second accommodation cavity 301, and the third accommodation cavity 501 in a direction shown by arrows in FIG. 8 or in a direction opposite to the direction shown by the arrows for heat dissipation. By forming the third accommodation cavity 501 in the fixed mechanism 31, the fixed mechanism 31 may be reused, and no additional accessories are required. A manufacturing process is relatively simple, and costs are relatively low. In addition, the third accommodation cavity 501 may also not be formed in the fixed mechanism 31. Instead, a connection point is disposed at other positions between the first heat dissipation member 41 and the second heat dissipation member 42, and a third accommodation cavity is formed at the connecting point. In this way, the circulation loop can also be enlarged, and the heat dissipation effect can also be enhanced.

It should be noted that, in this application, the rotary mechanism 32 includes the rotary shaft 321, the rotary wheel disposed about the rotary shaft 321, and the spring 324, for example. However, this is merely one of configuration manners of the rotary mechanism. Specific components of the rotary mechanism are not limited in this application, as long as the heat dissipation member can be connected to the rotary mechanism to achieve the heat dissipation effect. In addition, manners of connection and mating between the heat dissipation member and the rotary mechanism are also not limited.

In an embodiment, the heat dissipation member is connected to at least one of the first flat portion and the second flat portion. The heat dissipation member 40 is rotated with the rotary shaft 321. Since the rotary shaft 321 is connected to the flat portion, connecting the heat dissipation member 40 to at least one of the first flat portion 10 and the second flat portion 20 can provide support for the heat dissipation member 40. In this way, scratches or noises caused by bump against the flat portion as a result of dangling jitter of the heat dissipating member 40 during rotation with the rotary shaft 321 are avoided.

In an embodiment, a sliding groove is provided on at least one of the first flat portion and the second flat portion. The heat dissipation member is embedded in the sliding groove. The heat dissipation member is slid along the sliding groove during folding of the foldable display panel. During folding and unfolding of the foldable display panel, a relative displacement occurs between the heat dissipation member 40 and the corresponding flat portion. A direction of the displacement is perpendicular to an axis of the rotary shaft 321. In order to avoid scratches on the flat portion as a result of the relative displacement between the heat dissipation member 40 and the corresponding flat portion, a sliding groove may be provided on the flat portion. The heat dissipation member 40 is embedded in the sliding groove. During the folding of the foldable display panel, the heat dissipation member 40 may be slide back and forth in the sliding groove. A shape of the sliding groove matches a shape of the heat dissipation member 40. For example, the sliding groove may be two parallel sliding grooves perpendicular to the axis of the rotary shaft 321. Two opposite sides of the heat dissipation member 40 are slid along the two parallel sliding grooves. Alternatively, the sliding groove is a sliding groove extending from the rotary shaft cover 33 toward the flat portion, and the heat dissipation member 40 is slid back and forth in the sliding groove as a whole.

In an embodiment, at least part of the heat dissipation member is in a shape of a broken line or a curved line. Except for the part connected to the rotary shaft 321, other parts of the heat dissipation member 40 may be set to a shape of a broken line or a curved line. Within a same distance, the broken line or the curve line requires more heat dissipation materials and cooling media than a straight line. Therefore, the heat dissipation is more desirable. Certainly, the heat dissipation member 40 may also be linear. The shape of the heat dissipation member 40 is not limited in this application. The shape of the heat dissipation member 40 may be set as required.

Figure 9:
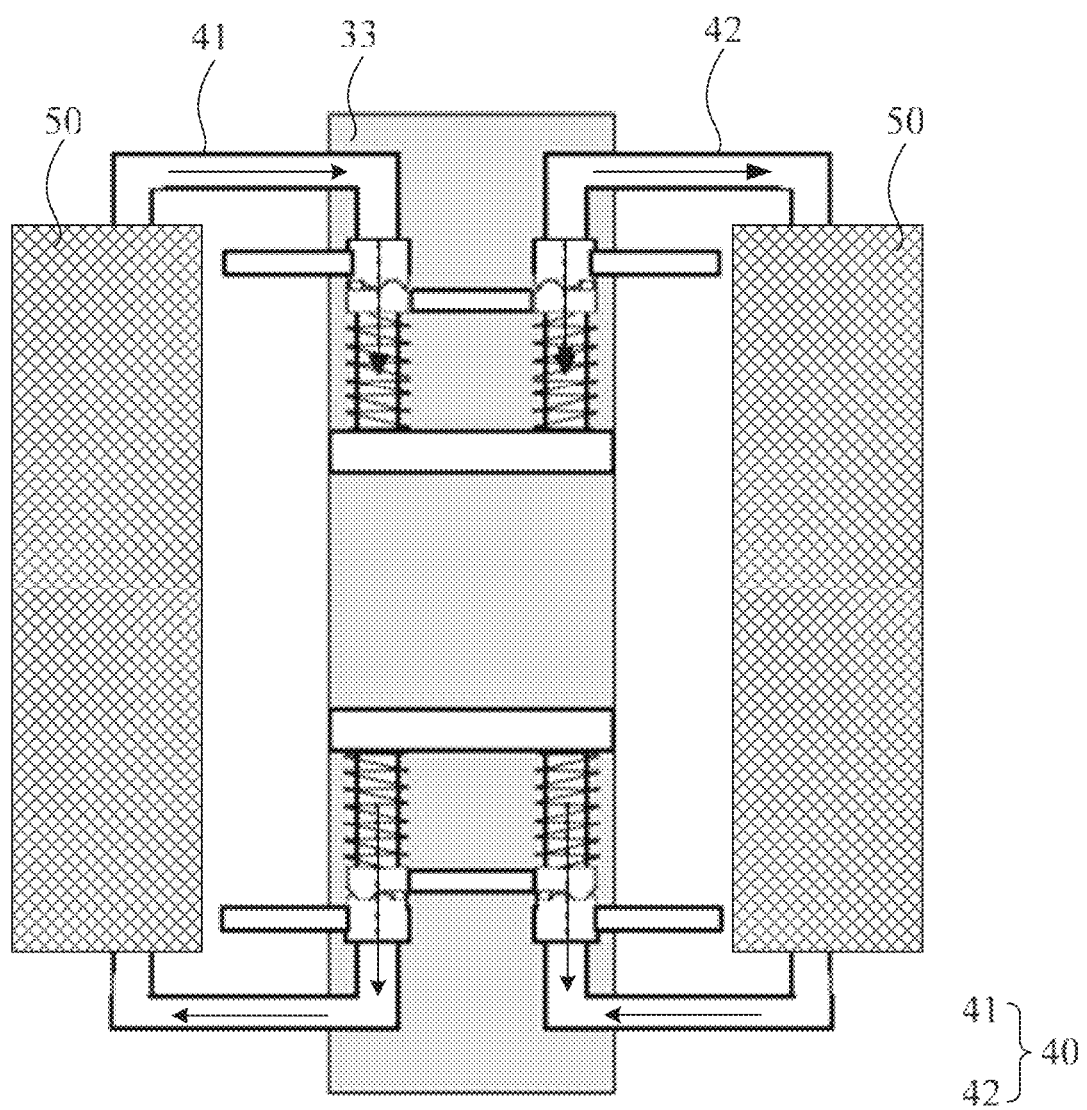
FIG. 9 is a schematic diagram of an eighth structure of the foldable portion and the heat dissipation member in the foldable display panel according to an embodiment of this application.

In an embodiment, heat dissipation fins are disposed on an outer wall of the heat dissipation member. A material of the heat dissipation member 40 may be a material having a relatively desirable heat dissipation effect, such as copper or aluminum. A material of the rotary shaft 321 may be the same or different, and may be a single material or a spliced material. In addition, as shown in FIG. 9, heat dissipation fins 50 are disposed on the outer wall of the heat dissipation member 40. The heat dissipation fins 50 are attached to the heat dissipation member 40 in a form of a sheet. The heat dissipation fins 50 increase a heat dissipation area and can further enhance the heat dissipation effect. A material of the heat dissipation fins 50 may be graphite or graphene. In addition, the heat dissipation fins 50 may also be wrapped on the outer wall of the heat dissipation member 40 in a form of a tube, which can also enhance the heat dissipation effect.

In the above embodiments, by means of the heat dissipation member 40, heat generated by the rotary mechanism is taken away during the folding of the display panel. In this way, abrasive dust on a contact surface caused by oxidation of lubricating grease at the rotary mechanism at a relatively high temperature is alleviated, reducing a risk of wear for the rotary mechanism. When the heat dissipation member 40 is connected to the flat portion, and the first heat dissipation member 41 is connected to the second heat dissipation member 42, heat of the display panel can be further dissipated. Heat generated at a flat portion in the foldable display panel that has a relatively large quantity of heating devices may be introduced to another flat portion by using the heat dissipation members 40 and the rotary shafts 321. In this way, overheating of the flat portion is alleviated and the heat dissipation effect of the whole body is enhanced. When the heat dissipation fins 50 are attached, the heat dissipation effect of the body is enhanced much greater.

According to the foregoing embodiments, it can be learned that:

This application provides a foldable display panel. The foldable display panel includes a flat portion, a foldable portion, and a heat dissipation member. The flat portion includes a first flat portion and a second flat portion. The foldable portion includes a fixed mechanism and a rotary mechanism rotatably connected to the fixed mechanism. The rotary mechanism includes a first rotary mechanism and a second rotary mechanism. The first rotary mechanism is connected to the first flat portion. The second rotary mechanism is connected to the second flat portion. The heat dissipation member is connected to at least one of the first rotary mechanism and the second rotary mechanism. According to this application, a heat dissipation member connected to the rotary mechanism is disposed. During the folding of the display panel, heat generated by the rotary mechanism is taken away by the heat dissipation member. In this way, abrasive dust on a contact surface caused by oxidation of lubricating grease at the rotary mechanism at a relatively high temperature is alleviated, reducing a risk of wear for the rotary mechanism.

In the foregoing embodiments, the descriptions of the embodiments have respective focuses. For a part that is not described in detail in an embodiment, reference can be made to the detailed description of other embodiments provided above, and the details will not be described herein again.

A foldable display panel provided in the embodiments of this application is described above in detail. Although the principles and implementations of the present disclosure application are described by using specific examples in this specification, the descriptions of the foregoing embodiments are merely used for helping understand the technical solutions and the core idea of the technical solutions of the present disclosure. A person of ordinary skill in the art should understand that modifications may be still made to the technical solutions described in the foregoing embodiments or equivalent replacements may be made to some technical features thereof, as long as such modifications or replacements do not make the essence of corresponding technical solutions depart from the scope of the technical solutions of the embodiments of the present disclosure.

What is claimed is:

1. A foldable display panel, comprising:
    a flat portion, comprising a first flat portion and a second flat portion;
    a foldable portion, comprising a fixed mechanism and a rotary mechanism rotatably connected to the fixed mechanism, wherein the rotary mechanism comprises a first rotary mechanism and a second rotary mechanism, the first rotary mechanism is connected to the first flat portion, and the second rotary mechanism is connected to the second flat portion; and a heat dissipation member, connected to at least one of the first rotary mechanism and the second rotary mechanism;

wherein a first accommodation cavity is formed in the heat dissipation member, and the first accommodation cavity is filled with a cooling medium;

wherein the rotary mechanism comprises a rotary shaft and a rotary wheel sleeved the rotary shaft, the rotary shaft is connected to the fixed mechanism, the rotary wheel is connected to the flat portion, and the heat dissipation member is fixedly connected to and coaxial with the rotary shaft.

2. The foldable display panel according to claim 1, wherein the cooling medium is a liquid.

3. The foldable display panel according to claim 1, wherein two ends of the heat dissipation member are fixedly connected to and coaxial with two ends of the rotary shaft respectively.

4. The foldable display panel according to claim 3, wherein the fixed mechanism comprises a first fixed sub-mechanism and a second fixed sub-mechanism independent of each other, the rotary mechanism comprises a first rotary sub-mechanism and a second rotary sub-mechanism, the first rotary sub-mechanism is connected to the first fixed sub-mechanism, the second rotary sub-mechanism is connected to the second fixed sub-mechanism, a first end of a rotary shaft of the first rotary sub-mechanism is connected to and coaxial with the heat dissipation member, a second end of the rotary shaft of the first rotary sub-mechanism is rotatably connected to the first fixed sub-mechanism, a first end of a rotary shaft of the second rotary sub-mechanism is rotatably connected to the second fixed sub-mechanism, and a second end of the rotary shaft of the second rotary sub-mechanism is fixedly connected to and coaxial with the heat dissipation member.

5. The foldable display panel according to claim 3, wherein the fixed mechanism comprises a first fixed sub-mechanism and a second fixed sub-mechanism independent of each other, the rotary mechanism comprises a first rotary sub-mechanism and a second rotary sub-mechanism, a rotary shaft of the first rotary sub-mechanism is rotatably connected to the first fixed sub-mechanism, a rotary shaft of the second rotary sub-mechanism is rotatably connected to the second fixed sub-mechanism, the heat dissipation member comprises a first heat dissipation sub-member and a second heat dissipation sub-member, two ends of the first heat dissipation sub-member are fixedly connected to and coaxial with two ends of the rotary shaft of the first rotary sub-mechanism respectively, and two ends of the second heat dissipation sub-member are fixedly connected to and coaxial with two ends of the rotary shaft of the second rotary sub-mechanism respectively.

6. The foldable display panel according to claim 5, wherein at least one first connection point is provided between the first heat dissipation sub-member and the second heat dissipation sub-member.

7. The foldable display panel according to claim 3, wherein the fixed mechanism comprises a first fixed sub-mechanism and a second fixed sub-mechanism independent of each other, the rotary mechanism comprises a first rotary sub-mechanism and a second rotary sub-mechanism, the first rotary sub-mechanism is connected to the first fixed sub-mechanism, the second rotary sub-mechanism is connected to the second fixed sub-mechanism, the first rotary sub-mechanism and the second rotary sub-mechanism share one rotary shaft, a first end of the rotary shaft is fixedly connected to and coaxial with a first end of the heat dissipation member, and a second end of the rotary shaft is fixedly connected to and coaxial with a second end of the heat dissipation member.

8. The foldable display panel according to claim 7, wherein at least one second connection point is provided between a middle of the rotary shaft and a middle of the heat dissipation member.

9. The foldable display panel according to claim 3, wherein the heat dissipation member and the connecting shaft are integrally formed.

10. The foldable display panel according to claim 3, wherein the heat dissipation member and the connecting shaft are separately formed.

11. The foldable display panel according to claim 3, wherein a second accommodation cavity is formed in the rotary shaft, the first accommodation cavity of the heat dissipation member communicates with the second accommodation cavity, and the cooling medium is filled in the first accommodation cavity and the second accommodation cavity.

12. The foldable display panel according to claim 3, wherein the first rotary mechanism is connected to a first heat dissipation member, the second rotary mechanism is connected to a second heat dissipation member, and at least one connection point exists between the first heat dissipation member and the second heat dissipation member.

13. The foldable display panel according to claim 12, wherein a second accommodation cavity is formed in the rotary shaft, a third accommodation cavity is formed in the fixed mechanism, the first accommodation cavity, the second accommodation cavity, and the third accommodation cavity communicate with each other, and the cooling medium is filled in the first accommodation cavity, the second accommodation cavity, and the third accommodation cavity.

14. The foldable display panel according to claim 1, wherein at least part of the heat dissipation member is in a shape of a broken line or a curved line.

15. The foldable display panel according to claim 1, wherein heat dissipation fins are disposed on an outer wall of the heat dissipation member.

16. The foldable display panel according to claim 15, wherein a material of the heat dissipation fins is graphite or graphene.

17. A foldable display panel, comprising:
a flat portion, comprising a first flat portion and a second flat portion;
a foldable portion, comprising a fixed mechanism and a rotary mechanism rotatably connected to the fixed mechanism, wherein the rotary mechanism comprises a first rotary mechanism and a second rotary mechanism, the first rotary mechanism is connected to the first flat portion, and the second rotary mechanism is connected to the second flat portion; and
a heat dissipation member, connected to at least one of the first rotary mechanism and the second rotary mechanism;
wherein the heat dissipation member is connected to at least one of the first flat portion and the second flat portion;
wherein a sliding groove is provided on at least one of the first flat portion and the second flat portion, the heat dissipation member is embedded in the sliding groove, and the heat dissipation member is slid along the sliding groove during folding of the foldable display panel.

* * * * *